United States Patent
Liu

(10) Patent No.: US 9,947,899 B2
(45) Date of Patent: Apr. 17, 2018

(54) FLEXIBLE DISPLAY DEVICE HAVING A SELF-HEALING CAPABILITY AND FABRICATION METHOD THEREOF

(71) Applicants: Shanghai Tianma Micro-electronics Co., Ltd., Shanghai (CN); Tianma Micro-electronics Co., Ltd., Shenzhen (CN)

(72) Inventor: Conghui Liu, Shanghai (CN)

(73) Assignees: SHANGHAI TIANMA MICRO-ELECTRONICS CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 15/373,951

(22) Filed: Dec. 9, 2016

(65) Prior Publication Data

US 2017/0092897 A1   Mar. 30, 2017

(30) Foreign Application Priority Data

Oct. 12, 2016   (CN) .......................... 2016 1 0889891

(51) Int. Cl.
| | | |
|---|---|---|
| H01L 51/56 | (2006.01) | |
| H01L 51/52 | (2006.01) | |
| H01L 51/00 | (2006.01) | |

(52) U.S. Cl.
CPC ........ *H01L 51/5259* (2013.01); *H01L 51/004* (2013.01); *H01L 51/5256* (2013.01); *H01L 51/0097* (2013.01); *H01L 51/56* (2013.01)

(58) Field of Classification Search
CPC ... H01L 51/56; H01L 51/5259; H01L 51/004; H01L 51/0097; H01L 51/5237
See application file for complete search history.

(56) References Cited

U.S. PATENT DOCUMENTS

| | | | | |
|---|---|---|---|---|
| 5,961,437 A | * | 10/1999 | Smith .................. | E02D 31/004 210/901 |
| 2015/0034916 A1 | * | 2/2015 | Lee ..................... | H01L 51/5246 257/40 |
| 2015/0060786 A1 | * | 3/2015 | Kwak ................. | H01L 51/5253 257/40 |
| 2016/0247936 A1 | * | 8/2016 | Yu ......................... | H01L 21/266 |
| 2016/0320803 A1 | * | 11/2016 | Oh ......................... | G06F 1/1652 |
| 2017/0256739 A1 | * | 9/2017 | Kim ..................... | H01L 51/5253 |

FOREIGN PATENT DOCUMENTS

CN     1710998 A     12/2005

* cited by examiner

*Primary Examiner* — Phuc Dang
(74) *Attorney, Agent, or Firm* — Anova Law Group, PLLC

(57) ABSTRACT

A flexible display device and fabrication method thereof are provided. The flexible display device includes a flexible substrate, a buffer layer disposed on the flexible substrate, a display unit disposed on the buffer layer covering a part of the buffer layer, and a thin film encapsulation layer disposed on the display unit and a rest part of the buffer layer. At least one of the buffer layer and the thin film encapsulation layer includes a self-healing layer comprising a self-healing polymer material.

15 Claims, 4 Drawing Sheets

(12) United States Patent
US 9,947,899 B2

FLEXIBLE DISPLAY DEVICE HAVING A SELF-HEALING CAPABILITY AND FABRICATION METHOD THEREOF

CROSS-REFERENCES TO RELATED APPLICATIONS

This application claims priority of Chinese Patent Application No. 201610889891.X, filed on Oct. 12, 2016, the entire contents of which are hereby incorporated by reference.

FIELD OF THE INVENTION

The present disclosure generally relates to the field of display technology and, more particularly, relates to a flexible display device, and a method for fabricating the flexible display device.

BACKGROUND

Through encapsulation, the flexible organic light-emitting diode (OLED) display panels prevent water and oxygen from invading the flexible OLED display panels, from getting in contact with the internal OLED components, and from affecting the electro-optical properties of the OLED components. Thus, the encapsulation quality is particularly important for the flexible OLED display panels.

Currently, a thin film encapsulation (TFE) process is often used as the encapsulation process for the flexible OLED display panels. By alternatingly depositing inorganic and organic layers that cover the OLED display components, the TFE process prevents the water and oxygen from entering the display region inside the flexible OLED display panels, thus showing an encapsulation effect.

However, during the deposition process of the alternating inorganic and organic layers, to prevent water vapor permeation through the organic layer from the border of the organic layer, the inorganic layer may need to be bent and cover the border of the organic layer. Thus, current multilayer encapsulation structures are vulnerable to mechanical damages (e.g., cracks) after long-term and repeated mechanical bending. Accordingly, the overall flexibility of the display panels may be reduced, and cracks may easily occur, thus creating a path for water vapor permeation through the cracks, which eventually results in functional failure.

The disclosed flexible display device and fabrication method thereof are directed to solving at least partial problems set forth above and other problems.

BRIEF SUMMARY OF THE DISCLOSURE

One aspect of the present disclosure provides a flexible display device. The flexible display device includes a flexible substrate, a buffer layer disposed on the flexible substrate, a display unit disposed on the buffer layer covering a part of the buffer layer, and a thin film encapsulation layer disposed on the display unit and a rest part of the buffer layer. At least one of the buffer layer and the thin film encapsulation layer includes a self-healing layer comprising a self-healing polymer material.

Another aspect of the present disclosure provides a method for fabricating a flexible display device. The method comprises fabricating a flexible substrate of the flexible display device, and forming a buffer layer on the flexible substrate. The buffer layer includes a display region and an encapsulation region. The method further comprises forming a display unit in the display region of the buffer layer, and forming a thin film encapsulation layer on the display unit and in the encapsulation region of the buffer layer, such that the display unit is encapsulated between the buffer layer and the thin film encapsulation layer. At least one of the buffer layer and the thin film encapsulation layer includes a self-healing layer comprising a self-healing polymer material.

Other aspects of the present disclosure can be understood by those skilled in the art in light of the description, the claims, and the drawings of the present disclosure.

BRIEF DESCRIPTION OF THE DRAWINGS

The above and other features and advantages of the present disclosure will be more apparent from the following detailed description of exemplary embodiments with reference to the accompanying drawings.

DETAILED DESCRIPTION

Figure 1:
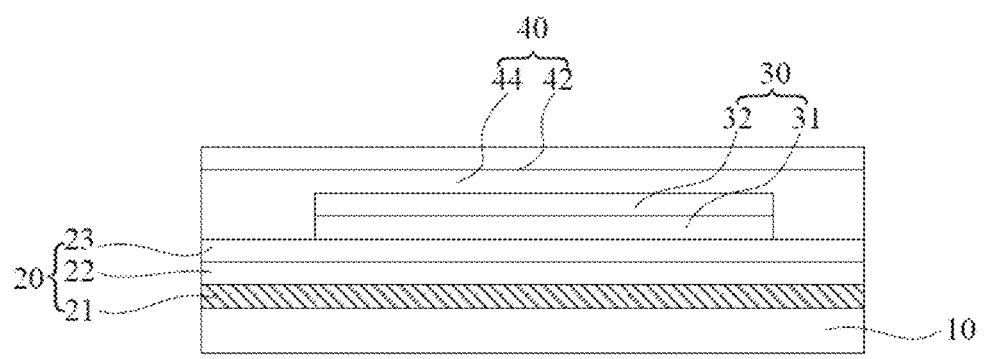
FIG. 1 illustrates a cross-sectional view of an exemplary flexible display device consistent with disclosed embodiments.

Exemplary embodiments will now be described more fully hereinafter with reference to the accompanying drawings. The exemplary embodiments, however, may be embodied in many different forms and should not be construed as limited to the embodiments set forth herein. Instead, these embodiments are provided so that the present disclosure will be illustrative as to the scope of the exemplary embodiments to those of ordinary skill in the art. In the drawings, the thickness of regions and layers may be for clarity exaggerated. The same reference number represents the same or similar structure in different drawings, and thus their detailed descriptions will be omitted.

It should be noted that, terms such as "upper" and "lower" are merely relative concepts or refer to intermediate states in a fabrication process, and should not be considered as limiting.

As discussed above, existing multilayer encapsulation structures are vulnerable to mechanical damages after long-term and repeated mechanical bending. Accordingly, the overall flexibility of the display panels may be reduced, and cracks may easily occur, thus creating a path for water vapor permeation through the cracks, which eventually results in functional failure.

Directed to solving at least partial problems set forth above and other problems, the present disclosure provides an improved flexible display device and a fabrication method thereof. According to the present disclosure, at least one of the buffer layer and the thin film encapsulation layer include a self-healing layer comprising a self-healing polymer material. Thus, cracks occurred in the fabrication and operation processes may be automatically healed, water-oxygen resistant abilities may be improved, thus ensuring the display effect of the display device and elongating the service life of the display device.

In the present disclosure, a "self-healing layer" may refer to a layer made of a polymer material having a self-healing function. The self-healing layer may heal microcracks hardly visible to the naked eyes during processing or operation process. Further, the disclosed self-healing layer may be made of an extrinsic or intrinsic self-healing polymer material. The extrinsic self-healing polymer material may be a microcapsule-based self-healing polymer material, a hollow fiber-based self-healing polymer material, a nanoparticle-based self-healing polymer material, a microvascular-based self-healing polymer material, or a carbon nanotube-based self-healing polymer material. The intrinsic self-healing polymer material may comprise dynamic covalent bond structures, reversible disulfide bond structures, reversible hydrogen bond structures, or π-π stacked structures. However, the above-listed materials are for illustrative purpose only, and are not intended to limit the scope of the present disclosure.

Specifically, the extrinsic self-healing polymer material may be a microcapsule-based self-healing polymer material, a hollow fiber-based self-healing polymer material, a nanoparticle-based self-healing polymer material, a microvascular-based self-healing polymer material, or a carbon nanotube-based self-healing polymer material.

The self-healing mechanism of the microcapsule-based self-healing polymer material may include embedding microcapsules comprising a healing agent into a polymer matrix material, and simultaneously, pre-embedding a catalyst into the polymer matrix material. Optionally, the catalyst may be first microencapsulated and then embedded in the polymer matrix material. After cracks occur in the polymer matrix material, the propagation of the cracks may lead to the rupture of the microcapsules. Thus, the healing agent may be released and diffuse towards the cracking regions under the siphon effect. After getting in contact with the catalyst, the released healing agent may polymerize and heal the cracks.

The microcapsule-based self-healing polymer material, for example, may specifically include a dicyclopentadiene (DCPD) self-healing agent system, or an epoxy self-healing agent system, etc. The DCPD self-healing agent system may comprise the DCPD as a self-healing agent encapsulated in the microcapsules, and Grubbs catalyst. When a crack propagates through the system, the DCPD may contact the Grubbs catalyst and undergo Ring Opening Metathesis Polymerization (ROMP) to heal the cracks. In particular, in-situ polymerization may be used to prepare microcapsules enclosing the DCPD as the core material, and further embed the microcapsules and the Grubbs catalyst in a resin matrix, thus realizing self-healing.

The epoxy self-healing agent system may use the epoxy as the self-healing agent. For example, melamine-formaldehyde resin may be used as the wall material to prepare a type of microcapsules comprising epoxy-tetrahydrophthalic acid diglycidyl ester as the core material. Simultaneously, another type of microcapsules using a mixture of liquid polythiol-pentaerythritol tetrakis(mercapto propionate) and benzyl dimethylamine catalyst as a curing agent may be prepared. Both the two types of microcapsules may be embedded in a bisphenol A-type epoxy matrix.

Other than the DCPD self-healing agent system and the epoxy self-healing agent system, the microcapsule-based self-healing polymer material may also include, for example, a phenyl acetate (PA) self-healing agent system, or an ethyl phenyl acetate (EPA) self-healing agent system. The self-healing mechanism of the PA or EPA self-healing system may include the self-healing agent permeating the cracks and forming hydrogen bonds with the epoxy in the matrix, and simultaneously, the epoxy continuing to be cured, thus realizing the self-healing of material.

The self-healing mechanism of the hollow fiber-based self-healing polymer material may include embedding the hollow fibers filled with a healing agent into the matrix material, and when damage occurs to the polymer material, the healing agent may be released from the hollow fibers to heal the cracks. Accordingly, the self-healing of the cracking region may be realized. The diameter of the hollow fibers may often be within approximately 40~200 μm, and in the matrix, the hollow fibers may be arranged to be vertically crossing with each other, in parallel to each other, or intersecting with each other in a certain angle.

Further, the self-healing mechanisms of the hollow fiber-based self-healing polymer material may be divided into three categories regarding the types of healing agents inside the hollow fibers. In the first category, the hollow fibers may be filled with a single-component healing agent, and the single-component healing agent may realize self-healing under the effect of the air and the like without any curing agent. In the second category, the healing agent and the curing agent may be injected into different hollow fibers, and the healing agent may need to get in contact with the curing agent to realize the self-healing process. In the third category, the healing agent may be injected to the hollow fibers, the curing agent may be enclosed in microcapsules and dispersed in the matrix material, and the same, the healing agent may also need to get in contact with the curing agent to realize the self-healing function.

The self-healing mechanism of the nanoparticle-based self-healing polymer material may include, when cracks occur in the polymer material, nanoparticles diffusing towards the cracking regions, and the diffused nanoparticles may fill the cracks to show a healing effect. The smaller the dimension of the nanoparticles, the easier the diffusion.

The self-healing mechanism of the microvascular-based self-healing polymer material may include embedding 3D microvascular networks into the material to continuously supplement the healing agent. Accordingly, the healing of the damages to the polymer material may be realized for multiple times. For example, the microvascular networks may be embedded into the epoxy matrix. Further, the microvascular networks may be prepared using the direct-write assembly printing technology, thus yielding a diameter of around 200 μm. DCPD monomers may be injected into the microvascular networks, and the 3D microvascular networks may be embedded into the epoxy matrix comprising the Grubbs catalyst.

Optionally, a two-component microvascular system may be used. Specifically, an epoxy healing agent and an amine curing agent may be injected into two groups of microvascular networks that are independent to each other, and the two-component microvascular system may then be embedded into the epoxy matrix material.

The self-healing mechanism of the carbon nanotube-based self-healing polymer material may include using the carbon nanotubes embedded in the matrix material as containers to store the healing agent. When cracks occur in the material, the carbon nanotubes may rupture, and the healing agent may be released and then be adsorbed in the cracks or participate in chemical reactions in the cracks to heal the cracks, thus realizing the self-healing function.

The intrinsic self-healing polymer material may perform self-healing for multiple times by utilizing molecular structures in the polymer material for reversible chemical reactions including reversible covalent bonding and reversible non-covalent bonding. The reversible covalent bonding may primarily refer to dynamic covalent reaction and disulfide bond formation, etc. The reversible non-covalent bonding may include π-π stacking, hydrogen bond self-healing, and ionic polymer, etc.

The self-healing polymer material comprising the dynamic covalent structures may be, but not limited to, poly(butyl acrylate) self-healing polymer comprising trithiocarbonate (TTC) units. The poly(butyl acrylate) self-healing polymer may be synthesized via a reversible addition-fragmentation termination (RAFT) process using the butyl acrylate (BA) and the TTC as the raw materials and the azodiisobutyronitrile (AIBN) as the initiator. Because the TTC units are photosensitive and show performance of dynamic covalent reforming, the poly(butyl acrylate) self-healing polymer comprising the TTC units may realize reversible self-healing under the effect of the ultraviolet light.

Specifically, when irradiated by light, one C—S bond in the TTC unit may break up and may easily react with other TTC units to form a new C—S bond. The reversible breaking and reforming of the bonding group in the TTC may realize the self-healing. The light irradiation may easily be controlled and carried out at the room temperature, and partial self-healing may be realized by controlling the area of the region irradiated by the light.

The polymer material that utilizes the disulfide bonds to realize intrinsic self-healing may be prepared by, but not limited to, using an epoxide comprising a polysulfide group (e.g., epoxy-terminated polysulfide, EPS 25) as the matrix and the polythiol-pentaerythritol tetrakis(3-mercapto propionate) as the curing agent. The epoxide comprising a polysulfide group and the polythiol-pentaerythritol tetrakis(3-mercapto propionate) may be immersed in a 4-dimethylaminopyridine (DMAP) solution with a concentration of 1 wt. %, and undergo the conjugation reaction at a constant temperature of 60° C. for 2 h. The epoxy group may open the epoxy ring(s) to react with the thiol group, thus curing the matrix.

The self-healing of the epoxide including a polysulfide group may be realized via the reversible exchange reaction of the disulfide bonds. Specifically, the chemical bond between the two sulfur atoms in the disulfide bond may break down, and sulfur atoms in different disulfide bonds may be connected to form new disulfide bonds. Because the disulfide bond shows the property to reform a chemical bond with the same or a different sulfur atom, the polymer material including the disulfide bond may perform self-healing under the effect of external factors such as binder-free, heating or an applied pressure. Further, the disulfide bond in the polymer material may break down and reform for multiple times. Accordingly, the polymer may realize the thorough healing of mechanical properties such as modulus and tensile strength.

The self-healing polymer material including the π-π stacked structure may utilize the supramolecular π-π stacking effect to improve the compatibility between two components in the two-component polymer blend, thus realizing the self-healing function. For example, the π electron-deficient polyimide and the π electron-rich pyrenyl-terminated organosilicon polymer may be used to prepare the two-component self-healing polymer blend. In the liquid state, the π electron-deficient group may react with the π electron-rich group to undergo the reversible complexation effect. Further, in the solid state, the two-component self-healing polymer blend may display a self-healing performance relatively sensitive to the temperature variance.

When the temperature increases, the intermolecular cross-linking between the molecules in the solid-state supramolecules may be broken, and one of the two components having a lower glass-transition temperature (e.g., organosilicon component) may simultaneously begin to flow. When the temperature decreases, the π-π stacking effect may prompt a new cross-linking network formed by the polymer blend. Accordingly, the two-component polymer blend may show a good self-healing ability.

For example, the polyimide and the pyrenyl-terminated telechelic polyurethane may be used as the raw materials to synthesize a self-healing supramolecular elastic polymer. Specifically, the polyimide and the pyrenyl-terminated telechelic polyurethane may be blended together via the π-π stacking between the π electron-deficient diimide group and the and the π electron-rich pyrenyl group. Both the ultra-violet visible (UV-Vis) spectrum and the fluorescence spectrum may indicate that π-π stacking exists in the polymer blend. Further, after the cracks of the polymer is healed, over 95% of the original tensile modulus and over 91% of the original elongation may be recovered.

The self-healing polymer material comprising a reversible hydrogen bond structure may, for example, be an elastomer that utilizes the reversible cross-linking effect to realize self-healing. The hydrogen bond-based self-healing system may include a functional group as shown in formula (1). The functional group shown in formula (1) may combine inner components of the self-healing polymer material via the hydrogen bonds, thus forming the cross-linking structure.

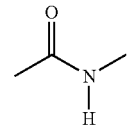

formula (1)

Accordingly, the original strength of the polymer material may be restored, and creep deformation of the polymer material under a load may be very small. Because the strength of supramolecular associative structure may be weaker than the covalent bond, when fracture or crack occurs, a large amount of non-associative groups may accumulate on the fracture surface. The non-associative groups may be very active. When getting in contact with the fracture surface, the non-associative groups may interact with each other via the hydrogen bonds, thus realizing the self-healing. Further, the healing effect may be improved with the elongation of the contact duration.

In one embodiment, a self-healing layer may be made of a composite material including hexagonal boron nitride nanosheets (BNNS) and a polymer material matrix comprising reversible hydrogen bond structures. However, the present disclosure is not limited thereto. That is, the self-healing layer made of the composite material including the BNNS and a polymer material matrix comprising reversible hydrogen bond structures is for illustrative purpose only, and is not intended to limit the present disclosure. The polymer material matrix including the reversible hydrogen bond structures may be formed by condensation polymerization of diethylenetriamine (DETA, H$_2$N—(CH$_2$)$_2$—NH—(CH$_2$)$_2$—NH$_2$) and a mixture of aliphatic dibasic acid and aliphatic tribasic acid. In particular, the aliphatic dibasic acid may be a compound shown in formula (2), and the aliphatic tribasic acid may be a compound shown in formula (3).

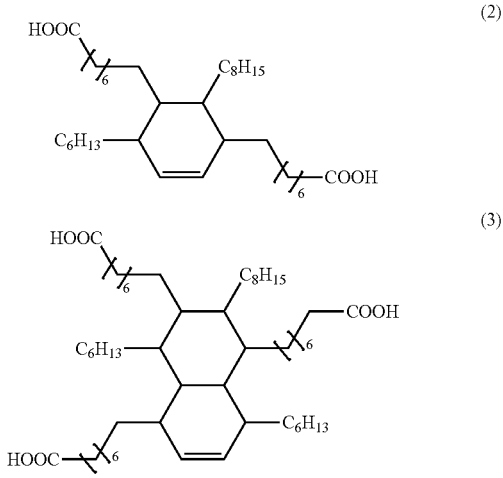

The hexagonal BNNS may form amidated hexagonal boron nitride nanosheets (BNNS-CONH$_2$) via surface modification. In the composite material, the hydrogen bonds may be formed between the BNNS-CONH$_2$ and the polymer material matrix including the reversible hydrogen bond structures. Further, the hydrogen bonds may be formed between molecules of the polymer material matrix, and inside the molecules of the polymer material matrix.

The self-healing mechanism of the composite material including the BNNS and the polymer material matrix comprising reversible hydrogen bond structures may include crystal layers of the BNNS being connected to each other via the hydrogen bond. Further, when two pieces of the composite material are placed close to each other, the electrostatic force may connect the two pieces of the composite material together. That is, if cracks or fractures occur during the fabrication or operation process of the composite material, the hydrogen bonds may be formed between the composite material on two sides of the cracks. Thus, the composite material may restore its original state, and the cracks may be healed, indicating that the composite material may effectively realize self-healing.

In particular, the volume fraction of the BNNS in the composite material may be within a range of approximately 2.5-10%. Because the content of the BNNS in the composite material may determine the heat or pressure needed in the self-healing process, those skilled in the art may properly choose the content of the BNNS in the composite material according to the requirement of fabrication or operation process. For example, the content of the BNNS in the composite material may be approximately 2.5 vol. %, 5 vol. %, 7 vol. %, 8 vol. %, or 10 vol. %. Further, the thickness of the self-healing layer may often be within a range of approximately 1-15 μm taking into consideration the following two aspects. When the thickness of the self-healing layer is thinner than 1 μm, the self-healing effect may not be significant. When the thickness of the self-healing layer is thicker than 15 μm, the flexibility of the self-healing layer may be affected and the thickness of the flexible display device may be increased.

FIG. 1 illustrates a cross-sectional view of an exemplary flexible display device consistent with disclosed embodiments. As shown in FIG. 1, the flexible display device may include a flexible substrate 10, a buffer layer 20, a display unit 30, and a thin film encapsulation layer 40. Specifically, in the disclosed flexible display device, the flexible substrate 10 may be fabricated using a flexible resin material. The flexible resin material may, for example, be polyimide, polystyrene, polyethylene glycol terephthalate, poly-p-xylylene, polyethersulfone (PES), or poly(ethylene naphthalate) (PEN), etc.

The buffer layer 20 may include a self-healing layer 21, a silicon nitride (SiN$_x$) layer 22, and a silicon oxide (SiO$_2$) layer 23. The self-healing layer 21 may self-heal microcracks that occur during the fabrication and operation processes of the flexible display device, thus preventing the water vapor, the air, and the dust, etc. from affecting the service life of the display device. The self-healing layer 21 may be made of a composite material including the BNNS and a polymer material matrix comprising reversible hydrogen bond structures. The thickness of the self-healing layer may be approximately 1-15 μm. The SiN$_x$ layer 22 may be disposed on the self-healing layer 21, and the SiO$_2$ layer 23 may be disposed on the SiN$_x$ layer 22. Accordingly, the adhesion between the different layers (i.e., the self-healing layer 21, the SiN$_x$ layer 22, the SiO$_2$ layer 23) may be improved, and further, the propagation of the cracks may be prevented. Simultaneously, a good adhesion between the SiO$_2$ layer 23 and other layers or structures, such as a low-temperature polysilicon (LTPS) layer, may be ensured.

The display unit 30 may include a low-temperature polysilicon (LTPS) layer 31 and an organic light-emitting diode (OLED) device layer 32. The display unit 30 may include a switch element and an OLED device, and the switch element may be used to control the OLED device to emit light. In some embodiment, the switch element may include a metal gate electrode layer, a semiconductor layer, and a metal source/drain electrode layer. In particular, the material of the semiconductor layer may be low-temperature polysilicon. That is, the semiconductor layer may be the LTPS layer 31. The display unit 30 may be encapsulated between the buffer layer 20 and the thin film encapsulation layer 40.

The thin film encapsulation layer 40 may include a first organic/inorganic material layer 42 and a second organic or inorganic material layer 44, as shown in FIG. 1. However, the present disclosure is not limited thereto. Optionally, the thin film encapsulation layer 40 may have a structure with alternating inorganic material layers and organic material layers. In particular, the organic material may be one or more materials selected from poly (ethylene naphthalate) (PEN), polyethylene glycol terephthalate, polyimide and poly-p-xylylene. The inorganic material may be one or more materials selected from Al$_2$O$_3$, SiN$_x$, and SiO$_x$N$_y$.

Further, the thin film encapsulation layer 40 may include one or a plurality of self-healing layers. Optionally, the thin film encapsulation layer 40 may have a structure with alternating self-healing layers and inorganic material layers. When more self-healing layers are included in the thin film encapsulation layer 40, the self-healing effect of the display device may be enhanced. However, too many self-healing layers may lead to an increase in the thickness of the flexible display device. Accordingly, the thin film encapsulation layer 40 may, optionally, have a structure of self-healing layer/inorganic material layer/self-healing layer/inorganic material layer/organic material layer.

Figure 2:
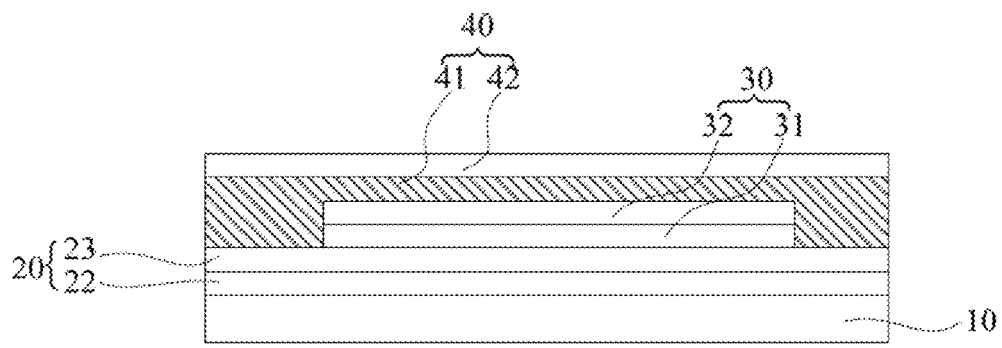
FIG. 2 illustrates a cross-sectional view of another exemplary flexible display device consistent with disclosed embodiments.

FIG. 2 illustrates a cross-sectional view of another exemplary flexible display device consistent with disclosed embodiments. Structures same as, or similar to that in FIG. 1 may refer to above corresponding descriptions, and structures different from FIG. 1 are described hereinafter. As shown in FIG. 2, in one embodiment, the thin film encapsulation layer 40 may include the first organic/inorganic material layer 42 and a first self-healing layer 41. The buffer layer 20 may no longer include the self-healing layer 21.

Figure 3:
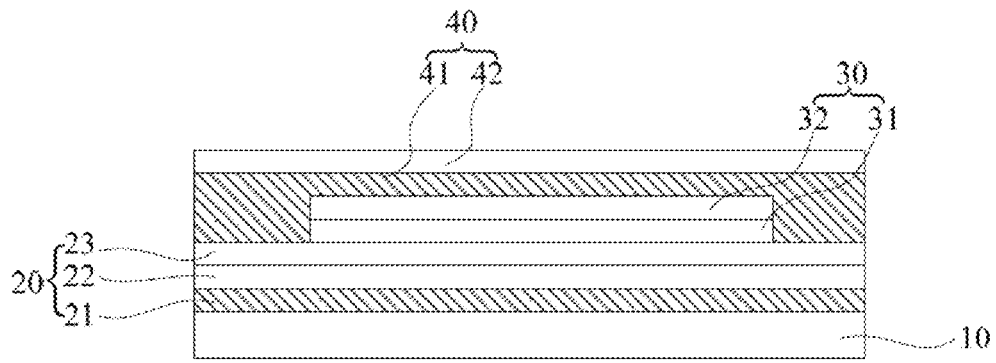
FIG. 3 illustrates a cross-sectional view of another exemplary flexible display device consistent with disclosed embodiments.

FIG. 3 illustrates a cross-sectional view of another exemplary flexible display device consistent with disclosed embodiments. Structures same as, or similar to that in FIG. 1 may refer to above corresponding descriptions, and structures different from FIG. 1 are described hereinafter. As shown in FIG. 3, in one embodiment, the thin film encapsulation layer 40 may include the first organic/inorganic material layer 42 and the first self-healing layer 41. The buffer layer 20 may include the self-healing layer 21, the $SiN_x$ layer 22, and the $SiO_2$ layer 23. The first self-healing layer 41 in the thin film encapsulation layer 40 and the self-healing layer 21 in the self-healing layer 21 may be made of the same self-healing material or different self-healing materials.

Figure 4:
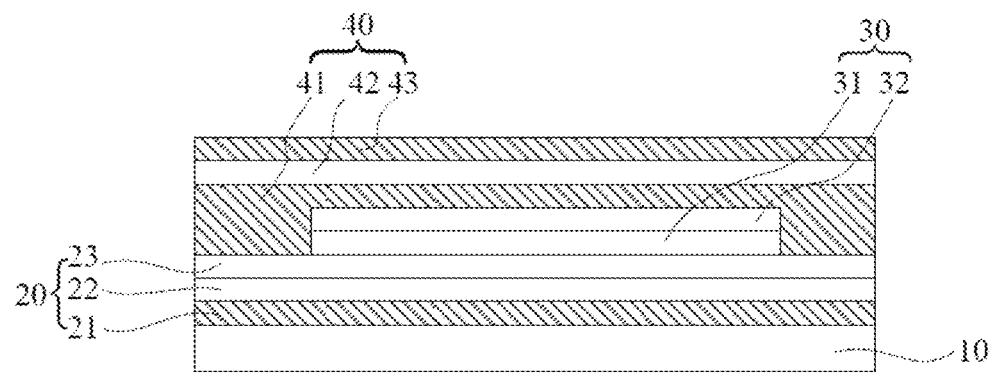
FIG. 4 illustrates a cross-sectional view of another exemplary flexible display device consistent with disclosed embodiments.

FIG. 4 illustrates a cross-sectional view of another exemplary flexible display device consistent with disclosed embodiments. Structures same as, or similar to that in FIG. 1 may refer to above corresponding descriptions, and structures different from FIG. 1 are described hereinafter. As shown in FIG. 4, in one embodiment, the thin film encapsulation layer 40 may include the first self-healing layer 41, a second self-healing layer 43, and the first organic/inorganic material layer 42 sandwiched between the first self-healing layer 41 and the second self-healing layer 43. The first self-healing layer 41 and the second self-healing layer 43 may be made of the same self-healing material or different self-healing materials. However, the present disclosure is not limited thereto, for example, instead of the first organic/inorganic material layer 42, a plurality of organic or inorganic material layers may be sandwiched between the first self-healing layer 41 and the second self-healing layer 43.

Figure 5:
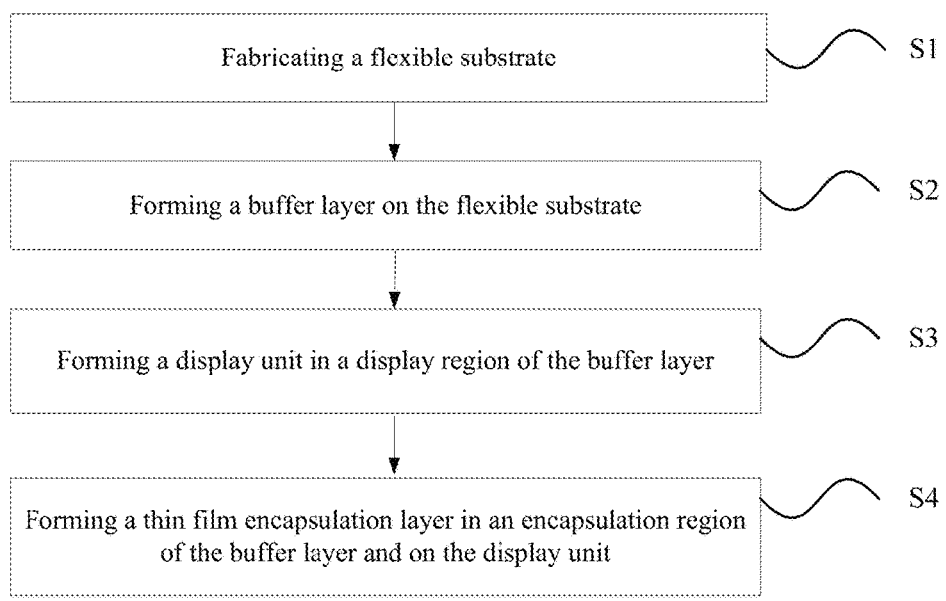
FIG. 5 illustrates a flow chart of a fabrication method of an exemplary flexible display device in FIG. 4 consistent with disclosed embodiments.

FIG. 5 illustrates a flow chart of a fabrication method of an exemplary flexible display device in FIG. 4 consistent with disclosed embodiments. Specifically, FIG. 5 illustrates a flow chart of a fabrication method of an exemplary flexible display device in FIG. 4 consistent with disclosed embodiments.

As shown in FIG. 5, the fabrication method of the flexible display device may include fabricating the flexible substrate 10, and forming the buffer layer 20 on the flexible substrate 10. In particular, the buffer layer 20 may include a display region and an encapsulation region. The fabrication method may further include forming the display unit 30 in the display region of the buffer layer 20, and forming the thin film encapsulation layer 40 in the encapsulation region of the buffer layer 20 and on the display unit 30. That is, the display unit 30 may be encapsulated between the buffer layer 20 and the thin film encapsulation layer 40.

Specifically, referring to FIG. 5, the fabrication method may include fabricating the flexible substrate 10 (S1). Because the flexible substrate 10 may be bent, to ensure the planarization of the flexible substrate 10 in an array fabrication process, a composite substrate including the flexible substrate 10 and a rigid substrate may be provided. In the composite substrate, the flexible substrate 10 may be disposed on the rigid substrate. Specifically, the flexible substrate 10 may be formed on the rigid substrate by a method of spin-coating or deposition. In particular, the rigid substrate may be a glass substrate or a quartz substrate.

Further, referring to FIG. 5, the fabrication method may include forming the buffer layer 20 on the flexible substrate 10 (S2). In one embodiment, as shown in FIG. 4, the buffer layer 20 may include the self-healing layer 21, the $SiN_x$ layer 22, and the $SiO_2$ layer 23. Thus, forming the buffer layer 20 on the flexible substrate 10 (S2) may include forming the self-healing layer 21 on the flexible substrate 10, then forming the $SiN_x$ layer 22 on the self-healing layer 21, and lastly forming the $SiO_2$ layer 23 on the $SiN_x$ layer 22. In particular, the $SiN_x$ layer 22 and the $SiO_2$ layer 23 may be formed sequentially on the self-healing layer 21 via a method such as chemical vapor deposition.

Specifically, the disclosed self-healing layer 21 may be made of a composite material including the $BNNS\text{-}CONH_2$ and the polymer material matrix comprising reversible hydrogen bond structures. However, those skilled in the art should understand that the present disclosure is not intended to be limiting, and the self-healing layer 21 may be made of any material having a self-healing function.

The $BNNS\text{-}CONH_2$ may be formed by first treating the BNNS to form hydroxylated boron nitride nanosheets (BNNS-OH), and then treating the BNNS-OH to form the $BNNS\text{-}CONH_2$. The polymer material matrix comprising reversible hydrogen bond structures may be formed by condensation polymerization of diethylenetriamine (DETA, $H_2N\text{—}(CH_2)_2\text{—}NH\text{—}(CH_2)_2\text{—}NH_2$) and a mixture of aliphatic dibasic acid and aliphatic tribasic acid. In particular, the chemical formulas of the aliphatic dibasic acid and the aliphatic tribasic acid may be shown in formula (2) and formula (3), respectively.

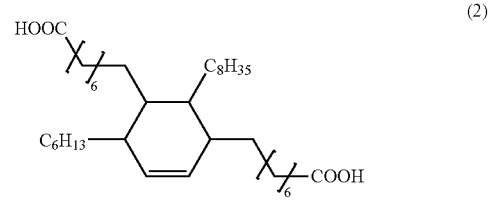

(2)

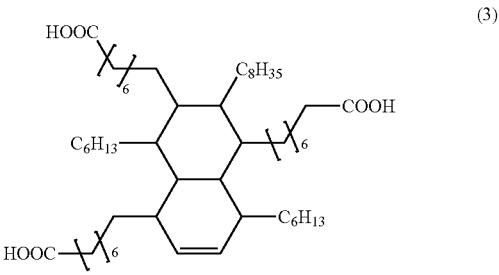

(3)

The $BNNS\text{-}CONH_2$ may be dispersed evenly in the polymer solution. The polymer solution with evenly dispersed $BNNS\text{-}CONH_2$ may be spreaded uniformly onto the flexible substrate 10, and then form the cured self-healing layer 21 after the solvent evaporates.

The volume fraction of the $BNNS\text{-}CONH_2$ in the self-healing layer may be within a range of approximately 2.5-10%. Because the content of nanosheets in the composite material may determine the heat or pressure needed in the self-healing process, those skilled in the art may properly choose the content of the nanosheets in the composite material according to the requirement of fabrication or operation process. For example, the content of the nanosheets in the composite material may be approximately 2.5 vol. %, 5 vol. %, 7 vol. %, 8 vol. %, or 10 vol. %.

Further, the spreading methods of the polymer solution may include spinning, slitting or inkjet-printing, thus controlling property parameters such as the thickness, evenness and surface roughness of the spreaded polymer solution.

Figure 6:
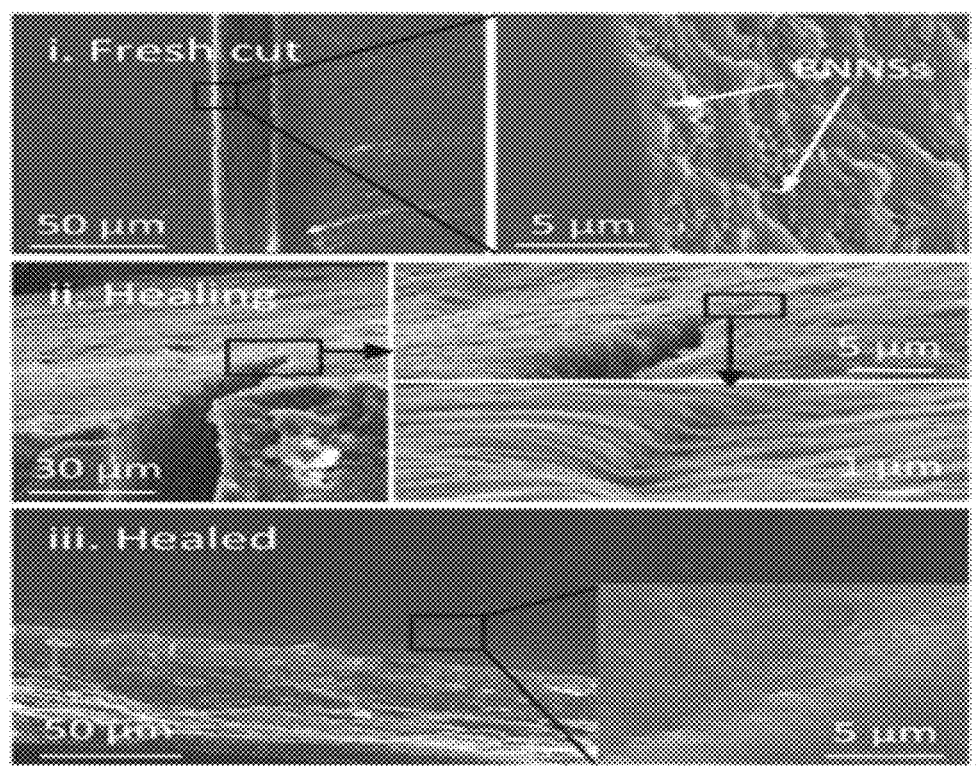
FIG. 6 illustrates a microscopic view of a crack and self-healing of a self-healing layer in an exemplary flexible display device in FIG. 4 consistent with disclosed embodiments.

FIG. 6 illustrates a microscopic view of the fracture and self-healing of the self-healing layer 21 in an exemplary flexible display device in FIG. 4 consistent with disclosed embodiments. As show in FIG. 6, when microcracks or fracture occur in the self-healing layer 21 ("Fresh cut"), the disclosed self-healing layer 21 may realize self-healing ("Healing"), thus avoiding functional failure of the display device caused by the invasion of the water vapor into the display device ("Healed").

The self-healing mechanism of the material shown in FIG. 6 may include crystal layers of the BNNS on surface of the composite material being connected to each other via the hydrogen bonds. Further, when two pieces of the composite material are placed close to each other, the electrostatic force may connect the two pieces of the composite material together. That is, if cracks or fracture occur during the fabrication or operation process of the composite material, the hydrogen bonds may be formed between the composite material on two sides of the cracks. Thus, the composite material may restore their original state, and the cracks may be healed, indicating that the composite material may effectively realize the self-healing.

Referring to FIG. 5, the fabrication method may further include forming the display unit 30 in the display region of the buffer layer 20 (S3). The display unit 30 may include the LTPS layer 31, and the OLED device layer 32 stacked on the LTPS layer 31. The LTPS layer 31 may be formed by conventional processing procedures such as deposition, exposure, developing, etching, demoulding, etc. The OLED device layer 32 may also be formed by conventional processing procedures.

Referring to FIG. 5, the thin film encapsulation layer 40 may be formed in the encapsulation region of the buffer layer 20 and on the display unit 30 (S4). The thin film encapsulation layer 40 may include the first self-healing layer 41, the first organic/inorganic material layer 42, and the second self-healing layer 43. The material and fabrication method of the first self-healing layer 41 and the second self-healing layer 43 may be the same as that of the self-healing layer 21 in the buffer layer 20, which is not described in detail here.

In the first organic/inorganic material layer 42, the organic material layer may be formed by methods such as evaporation and coating, and the inorganic material layer may be formed by methods such as deposition. By comprising two self-healing layers (i.e., the first self-healing layer 41 and the second self-healing layer 43), the disclosed thin film encapsulation layer 40 may more effectively block the path through which the water vapor enters the display device. Accordingly, the display effect of the display device may be ensured, and the service life of the display device may be elongated.

By using the disclosed flexible display device, at least one of the buffer layer and the thin film encapsulation layer may include a self-healing layer comprising a self-healing polymer material. Thus, cracks occurred in the fabrication and operation processes may be automatically healed, and water-oxygen resistant abilities may be improved, thus ensuring the display effect of the display device and elongating the service life of the display device.

Although the foregoing is detailed description of the present disclosure with reference to specific preferred embodiments, it should be understood that the present disclosure is not limited to the embodiments disclosed. For those skilled in the art to which the present disclosure belongs, various simple modifications and alterations can be made without departing from the spirit of the present invention, and shall all fall within the scope of the present disclosure

What is claimed is:

1. A flexible display device, comprising:
   a flexible substrate;
   a buffer layer disposed on the flexible substrate;
   a display unit disposed on the buffer layer covering a part of the buffer layer; and
   a thin film encapsulation layer disposed on the display unit and a rest part of the buffer layer,
   wherein at least one of the buffer layer and the thin film encapsulation layer includes a self-healing layer comprising a self-healing polymer material, and
   the self-healing layer includes a polymer material matrix comprising reversible hydrogen bond structures, and a composite material comprising amidated hexagonal boron nitride nanosheets.

2. The flexible display device according to claim 1, wherein:
   the buffer layer and the thin film encapsulation layer each includes the self-healing layer; and
   the self-healing layer in the buffer layer and the self-healing layer in the thin film encapsulation layer are made of a same material or made of different materials.

3. The flexible display device according to claim 1, wherein:
   the self-healing layer is made of at least one of an extrinsic self-healing polymer material and an intrinsic self-healing polymer material.

4. The flexible display device according to claim 3, wherein:
   the intrinsic self-healing polymer material include at least one of dynamic covalent structures, reversible disulfide bond structures, reversible hydrogen bond structures, and π-π stacked structures.

5. The flexible display device according to claim 4, wherein:
   the intrinsic polymer material is a polymer material comprising the reversible hydrogen bond structures.

6. The flexible display device according to claim 1, wherein:
   the polymer material matrix comprising the reversible hydrogen bond structures is formed by condensation polymerization of diethylenetriamine and a mixture of aliphatic dibasic acid and aliphatic tribasic acid.

7. The flexible display device according to claim 6, wherein:
   the aliphatic dibasic acid is a compound represented as

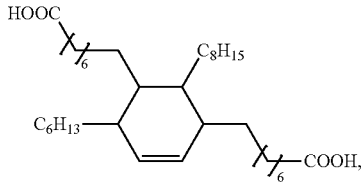

and the aliphatic tribasic acid is a compound represented as

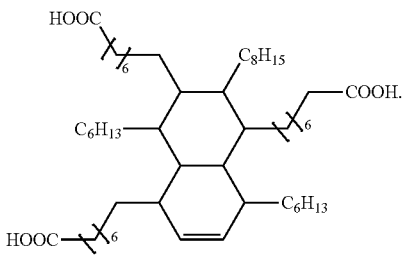

8. The flexible display device according to claim 1, wherein:
a volume fraction of the hexagonal boron nitride nanosheets in the self-healing layer is within approximately 2.5-10%.

9. The flexible display device according to claim 1, wherein:
the buffer layer includes the self-healing layer, a silicon nitride layer, and a silicon oxide layer sequentially.

10. The flexible display device according to claim 1, wherein:
the display unit includes a low-temperature polysilicon layer and an organic light-emitting diode device layer disposed on the low-temperature polysilicon layer.

11. The flexible display device according to claim 1, wherein:
the thin film encapsulation layer includes a first self-healing layer and a material layer, wherein the material layer is an organic layer or an inorganic layer.

12. The flexible display device according to claim 11, wherein:
the thin film encapsulation layer further includes a second self-healing layer.

13. The flexible display device according to claim 12, wherein:
the first self-healing layer and the second self-healing layer are made of a same material or made of different materials.

14. The flexible display device according to claim 1, wherein:
a thickness of the self-healing layer is within a range of approximately 1-15 μm.

15. A flexible display device, comprising:
a flexible substrate;
a buffer layer disposed on the flexible substrate;
a display unit disposed on the buffer layer covering a part of the buffer layer; and
a thin film encapsulation layer disposed on the display unit and a rest part of the buffer layer, wherein the thin film encapsulation layer has a structure with alternating inorganic material layers and organic material layers, and is configured to encapsulate the display unit between the buffer layer and the thin film encapsulation layer,
wherein at least one of the buffer layer and the thin film encapsulation layer includes a self-healing layer comprising a self-healing polymer material,
when the thin film encapsulation layer includes the self-healing layer, the self-healing layer is in direct contact with the display unit,
when the buffer layer includes the self-healing layer, the buffer layer includes the self-healing layer, a silicon nitride layer and a silicon oxide layer sequentially disposed on flexible substrate.

* * * * *